United States Patent
Sreekiran

(10) Patent No.: US 8,198,932 B2
(45) Date of Patent: Jun. 12, 2012

(54) VOLTAGE GENERATING CIRCUIT FOR AN ATTENUATOR

(75) Inventor: Samala Sreekiran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 222 days.

(21) Appl. No.: 12/774,737

(22) Filed: May 6, 2010

(65) Prior Publication Data

US 2011/0273217 A1    Nov. 10, 2011

(51) Int. Cl.
*H03L 5/00*    (2006.01)
(52) U.S. Cl. ...................... 327/308; 333/81 R
(58) Field of Classification Search .................. 327/306, 327/308; 333/81 R
See application file for complete search history.

(56) References Cited

U.S. PATENT DOCUMENTS

| | | | | |
|---|---|---|---|---|
| 4,496,860 A | * | 1/1985 | Tokumo | 327/308 |
| 5,703,909 A | * | 12/1997 | Fang et al. | 375/295 |
| 7,372,313 B2 | * | 5/2008 | De Fazio et al. | 327/308 |
| 7,521,980 B2 | * | 4/2009 | Koen | 327/308 |

* cited by examiner

*Primary Examiner* — Dinh T. Le
(74) *Attorney, Agent, or Firm* — John R. Pressetto; W. James Brady; Frederick J. Telecky, Jr.

(57) ABSTRACT

A circuit includes a digital-to-analog converter (DAC), coupled to a power supply, that provides a first current at a first output terminal of the DAC and a second current at a second output terminal of the DAC, the first current being differential to the second current; a first circuit, coupled to the first output terminal of the DAC and to the second output terminal of the DAC, that generates a first voltage and a second voltage, the first voltage being non-linear with respect to the first current and the second voltage being non-linear with respect to the second current; and an attenuator coupled to the first circuit, and responsive to the first voltage and the second voltage to attenuate an input signal of the attenuator and to generate linear attenuation characteristics in decibels with respect to the first current and the second current.

11 Claims, 6 Drawing Sheets

VOLTAGE GENERATING CIRCUIT FOR AN ATTENUATOR

TECHNICAL FIELD

Embodiments of the disclosure relate to a voltage generating circuit for an attenuator.

BACKGROUND

An attenuator is used in a transceiver or a radio frequency (RF) transmitter to attenuate power of an RF signal that is to be transmitted to a receiver. Attenuation is controlled using control voltages supplied to the attenuator. The attenuator, typically, provides non-linear output in decibels that affects performance of the receiver while receiving RF signals of low power.

An exemplary circuit 100 for generating the control voltages is illustrated in FIG. 1(A) (Prior Art). The circuit 100 includes a digital-to-analog converter (DAC) 105, an isolation circuit 110A, an isolation circuit 110B, a resistor 115A, and a resistor 115B. The DAC 105 provides two currents that are differential to each other. The control voltages are obtained at nodes 120A and 120B by enabling flow of a first current through the resistor 115A and enabling flow of a second current through the resistor 115B. A first voltage (Vs), obtained at node 110A, is linear with respect to the first current and a second voltage (Vp), obtained at node 110B, is linear with respect to the second current. The control voltages, when applied to the attenuator, generate non-linear attenuation characteristics in decibels (dB). Equation (1) illustrates the attenuation (A) of the attenuator.

$$A = \frac{1}{1 + \frac{(a - a')}{k(1 - a - a')}} \quad (1)$$

where a is a ratio of the first current and a maximum current from the DAC 105, a' is a ratio of threshold voltages of transistors used in the attenuator to which the first voltage (Vs) and the second voltage (Vp) are applied, and a product of the maximum current from the DAC 105 and resistance of the resistor 115A, and k is a constant representing a ratio of sizes of transistors of the attenuator. By substituting values of a, a' and k in equation (1), a waveform 125 as illustrated in FIG. 1(B) can be obtained between the attenuation (A) and the first current (I). The waveform 125 indicates non-linear characteristics in dB. Further, the attenuation obtained using the control voltages is process-voltage-temperature (PVT) dependent as a' is a function of the threshold voltages. Resolution of the DAC 105 also needs to be higher due to the non-linear attenuation characteristics in dB and dependence of the attenuation characteristics on the PVT.

SUMMARY

An example of a circuit includes a digital-to-analog converter (DAC), coupled to a power supply, that provides a first current at a first output terminal of the DAC and a second current at a second output terminal of the DAC. The first current is differential to the second current. The circuit also includes a first circuit coupled to the first output terminal of the DAC and to the second output terminal of the DAC. The first circuit generates a first voltage and a second voltage. The first voltage is non-linear with respect to the first current and the second voltage is non-linear with respect to the second current. The circuit further includes an attenuator coupled to the first circuit, and responsive to the first voltage and the second voltage to attenuate an input signal and to generate linear attenuation characteristics in decibels with respect to the first current and the second current.

An example of a circuit for generating voltages for operating an attenuator includes a digital-to-analog converter (DAC) that provides a first current at a first output terminal of the DAC and a second current at a second output terminal of the DAC. The first current is differential to the second current. The circuit also includes a first plurality of transistors and a second plurality of transistors. The first plurality of transistors is coupled in a series connection to the first output terminal of the DAC to define a first path for the first current. The first plurality of transistors is responsive to the first current to generate a first voltage that is non-linear with respect to the first current. The second plurality of transistors are coupled in a series connection to the second output terminal of the DAC to define a second path for the second current and that are responsive to the second current to generate a second voltage that is non-linear with respect to the second current. The circuit further includes a control circuit coupled to gates of a first one of the first plurality of transistors and of a first one of the second plurality of transistors. The control circuit controls voltages at the gates of the first one of the first plurality of transistors and of the first one of the second plurality of transistors. Moreover, the circuit includes a first isolation circuit and a second isolation circuit. The first isolation circuit is coupled to a gate of a second one of the first plurality of transistors to isolate voltage at the gate of the second one of the first plurality of transistors from interfering with an input signal of the attenuator. The second isolation circuit is coupled to a gate of a second one of the second plurality of transistors to isolate voltage at the gate of the second one of the second plurality of transistors from interfering with the input signal of the attenuator.

An example of a method includes generating a first current and a second current by a digital-to-analog converter (DAC). The method also includes generating a first voltage, in response to the first current, and a second voltage, in response to the second current. The first voltage is non-linear with respect to the first current and the second voltage is non-linear with respect to the second current. The method further includes driving an attenuator based on the first voltage and the second voltage to attenuate an input signal of the attenuator and to enable the attenuator to generate linear attenuation characteristics in decibels with respect to the first current and the second current.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1A:
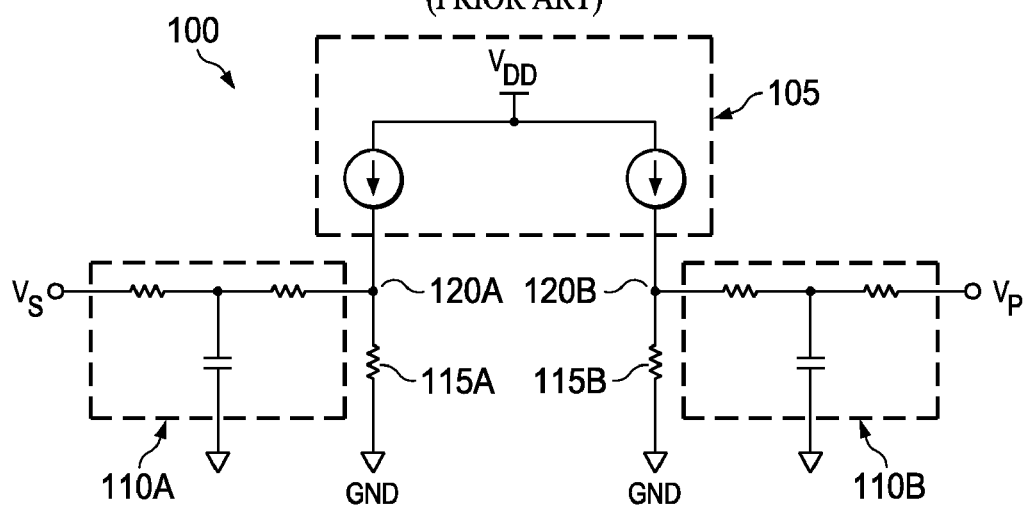
FIG. 1(A) illustrates a voltage generating circuit, in accordance with prior art.
Figure 1B:
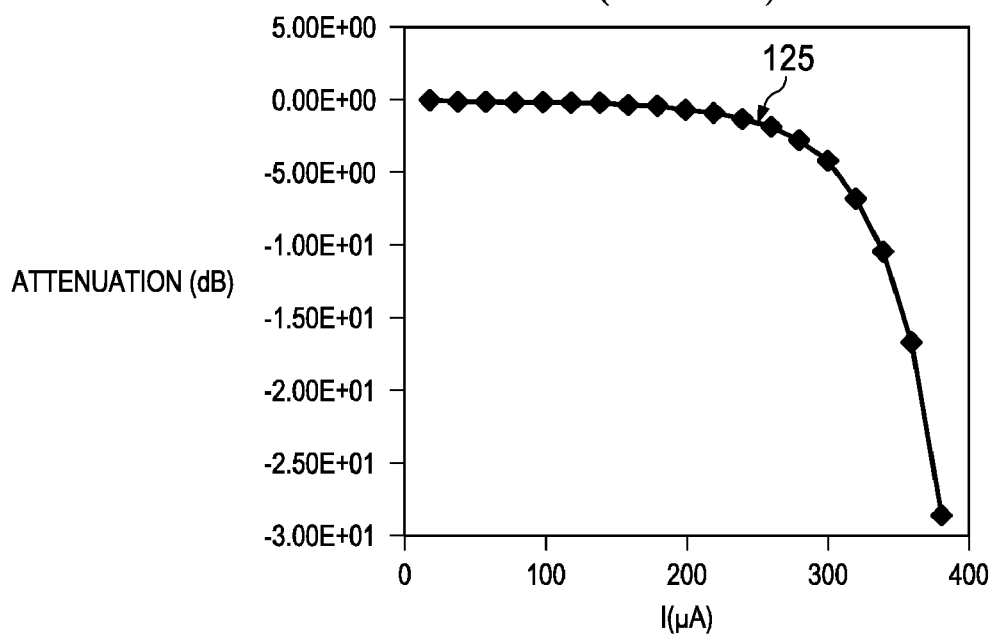
FIG. 1(B) illustrates attenuation characteristics of an attenuator, in accordance with prior art.
Figure 2:
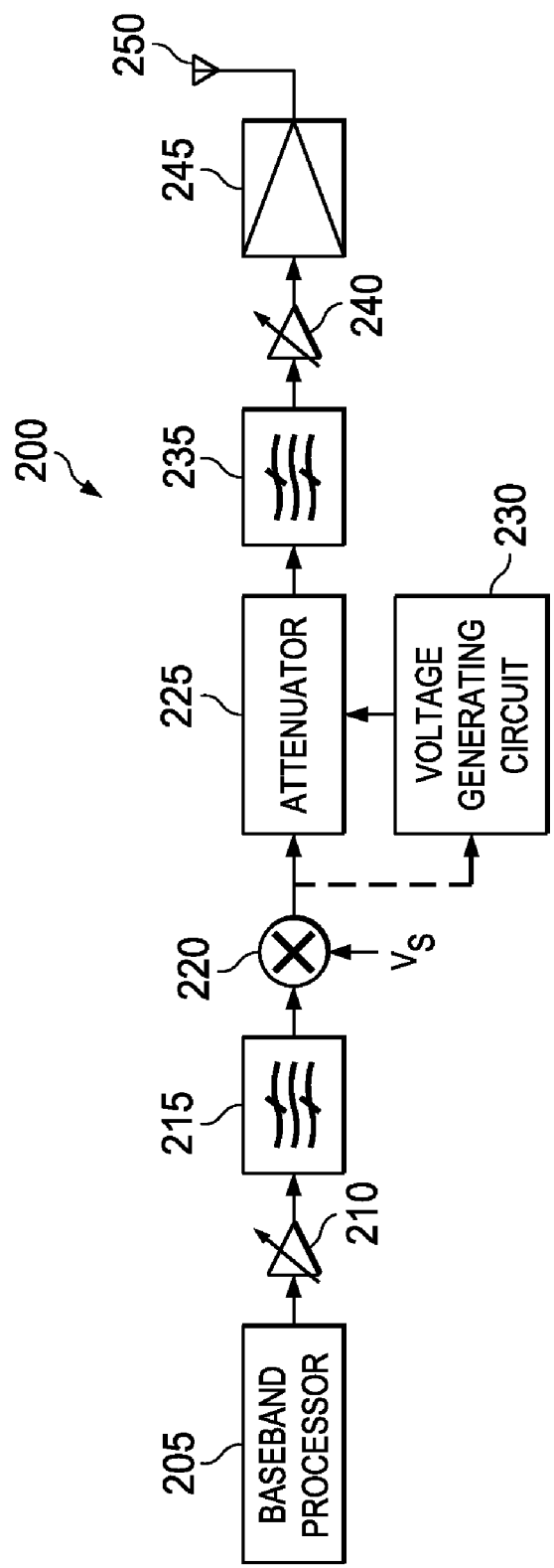
FIG. 2 illustrates an environment, in accordance with one embodiment.

FIG. 2 illustrates an environment 200, for example a radio frequency (RF) transmitter or a transceiver. The environment 200 includes a baseband processor 205, a variable gain amplifier 210, a low pass filter (LPF) 215, a mixer 220, an attenuator 225, a voltage generating circuit 230, a band pass filter (BPF) 235, a variable gain amplifier 240, a power amplifier 245, and an antenna 250. The variable gain amplifier 210, the LPF 215, the mixer 220, and the attenuator 230 can be combined to represent a frequency-up converter. The frequency-up converter translates an output spectrum of the baseband processor 205 to an RF frequency which results in an RF signal.

The baseband processor 205 converts an input baseband signal into symbols. The variable amplifier 210, coupled to the baseband processor 205, amplifies the symbols based on a predetermined amplification level, and then provides amplified symbols to the LPF 215. The LPF 215 removes a first noise component from the amplified symbols and then outputs a resulting signal to the mixer 220. The mixer 220 converts the resulting signal into the RF signal of a predetermined band.

In order to control output power delivered by the RF transmitter, the RF signal is input to the attenuator 225. The attenuator 225, which is a voltage controlled attenuator, attenuates the RF signal in response to voltages generated by the voltage generating circuit 230. The voltage generating circuit 230 including various elements is explained in conjunction with FIG. 3.

The BPF 235 receives the RF signal that is attenuated using the attenuator 225. The BPF 235 removes a second noise component generated during attenuation, and provides the RF signal to the variable gain amplifier 240. The variable gain amplifier 240 amplifies the RF signal by a predetermined value, and outputs the RF signal to a power amplifier 245. The power amplifier 245 amplifies power level of the RF signal to the power level required for transmission of the RF signal, and transmits the RF signal via the antenna 250.

Figure 3:
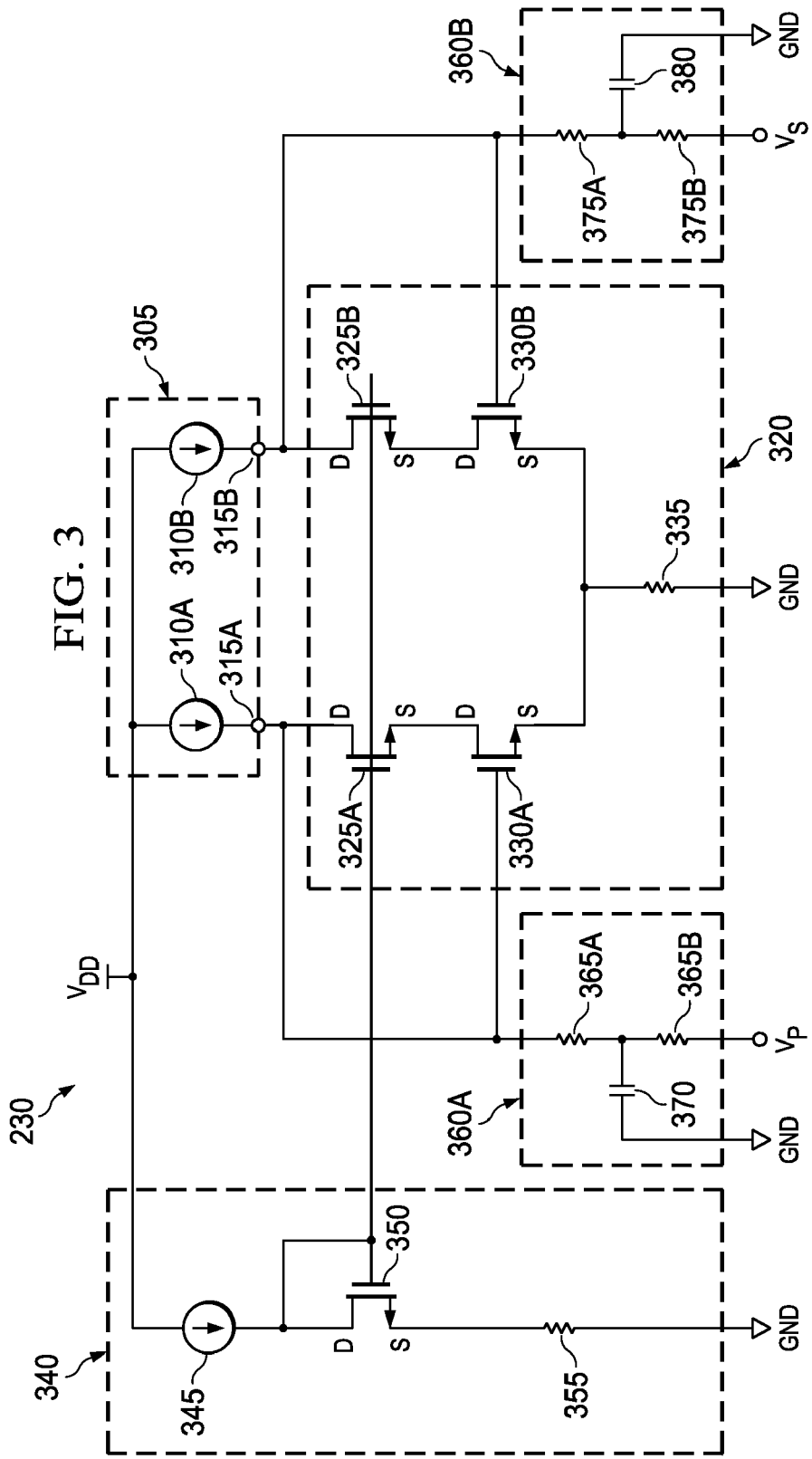
FIG. 3 illustrates a voltage generating circuit, in accordance with one embodiment.

Referring now to FIG. 3, the voltage generating circuit 230 includes a digital-to-analog converter (DAC) 305. The DAC 305 includes a first current source 310A, hereinafter referred to as the current source 310A. The DAC 305 includes a second current source 310B, hereinafter referred to as the current source 310B. One terminal of each of the current source 310A and the current source 310B is coupled to a power supply (VDD).

The voltage generating circuit 230 also includes a first circuit 320, hereinafter referred to as the circuit 320, coupled to the DAC 305. The circuit 320 includes a first transistor 325A, hereinafter referred to as the transistor 325A, coupled to a first output terminal 315A, hereinafter referred to as the output terminal 315A. The circuit 320 includes a second transistor 330A, hereinafter referred to as the transistor 330A, coupled to the transistor 325A. The circuit 320 also includes a third transistor 325B, hereinafter referred to as the transistor 325B, coupled to a second output terminal 315B, hereinafter referred to as the output terminal 315B. A fourth transistor 330B, hereinafter referred to as the transistor 330B, is coupled to the transistor 325B. The transistor 325A has a drain coupled to the current source 310A and the output terminal 315A that is defined by the current source 310A, and a source coupled to a drain of the transistor 330A. The transistor 325B has a drain coupled to the current source 310B and the output terminal 315B that is defined by the current source 310B, and a source coupled to a drain of the transistor 330B. The transistor 330A has a gate coupled to the drain of the transistor 325A and a source coupled to a terminal of a resistor 335. The transistor 330B has a gate coupled to the drain of the transistor 325B and a source coupled to the terminal of the resistor 335. Another terminal of the resistor 335 is further coupled to a ground supply (GND).

The voltage generating circuit 230 further includes a second circuit 340, hereinafter referred to as the circuit 340. The circuit 340 includes a current source 345, a diode 350, and a resistor 355. The diode 350 can be a transistor based diode. One terminal of the current source 310A is coupled to the power supply and other terminal is coupled to a drain of the diode 350. The diode 350 has a gate coupled to a gate of the transistor 325A and a gate of the transistor 325B, and a source coupled to one terminal of the resistor 355. Another terminal of the resistor 355 is coupled to the ground supply.

In some embodiments, the transistor 325A, the transistor 325B, and the diode 350 are identical negative metal oxide semiconductor (NMOS) type transistors having similar gain beta 1. The transistor 330A and the transistor 330B are also NMOS type transistors identical to each other and having the gain beta 1 or a gain different than beta 1.

The voltage generating circuit 230 also includes a first isolation circuit 360A, hereinafter referred to as the isolation circuit 360A, and a second isolation circuit 360B, hereinafter referred to as the isolation circuit 360B. The isolation circuit 360A is coupled to the output terminal 315A and to the gate of the transistor 330A. The isolation circuit 360A includes a resistor 365A, a resistor 365B, and a capacitor 370. The capacitor 370 is coupled between the resistor 365A and the resistor 365B, and the ground supply. The isolation circuit 360B is coupled to the output terminal 315B and to the gate of the transistor 330B. The isolation circuit 360B includes a resistor 375A, a resistor 375B, and a capacitor 380. The capacitor 380 is coupled between the resistor 375A and the resistor 375B, and the ground supply.

In some embodiments, the resistor 365A, the resistor 365B, the resistor 375A and the resistor 375B can be identical in size and resistances. The capacitor 370 and the capacitor 380 can also be identical having capacitances similar to each other.

The working of the voltage generating circuit 230 to operate an attenuator, for example the attenuator 225, is explained as follows. The current source 310A generates the first current at the output terminal 315A based on a DAC code of the DAC 305, and the current source 310B generates the second current at the output terminal 315B. The second current is differential to the first current. In one aspect, the second current being differential to the first current indicates that when the first current increases by a value, the second current decreases by an equal value and vice versa. The circuit 320 is responsive to the first current and the second current to generate a first voltage (Vp) and a second voltage (Vs) respectively.

The first current (I) is determined as $$I = \beta(Vp - Vt)\left(\sqrt{\frac{2Im}{\beta}} - \sqrt{\frac{2I}{\beta}}\right) \tag{2}$$

where β is an attenuation coefficient, Vp is the first voltage, Vt is a threshold voltage of the transistor 330A, and Im is a maximum current generated from the current source 345 for the voltage generating circuit 230.

The second current (I−Im) is determined as $$I - Im = \beta(Vs - Vt)\left(\sqrt{\frac{2Im}{\beta}} - \sqrt{\frac{2(I - Im)}{\beta}}\right) \quad (3)$$

where β is the attenuation coefficient, Vs is the second voltage, Vt is a threshold voltage of the transistor 330B, and Im is the maximum current generated from the current source 345 for the voltage generating circuit 230.

In some embodiments, when the first current is equal to the maximum current, gate to source voltage of the transistor 325A is equal to gate to source voltage of the diode 350, and drain to source voltage of the transistor 330A is zero. Since gate voltage of the transistor 325A is controlled and set by the diode 350, the drain to source voltage of the transistor 330A can also be varied and controlled using the diode 350. By varying the drain to source voltage of the transistor 330A, gate voltage of the transistor 330A and hence the first voltage can be controlled. Similarly, the diode 350 controls and sets gate voltage of the transistor 325B thereby controlling drain to source voltage of the transistor 330B, gate voltage of the transistor 330B and the second voltage. The gate to source voltage of the diode 350 is equal to sum of the gate to source voltage of the transistor 325A and the drain to source voltage of the transistor 330A when the resistor 335 and the resistor 355 have equal resistances. The gate to source voltage of the diode 350 is also equal to sum of gate to source voltage of the transistor 325B and drain to source voltage of the transistor 330B.

The transistor 325A is active and the first current flows through the output terminal 315A, the transistor 325A, the transistor 330A, and the resistor 335. The output terminal 315A, the transistor 325A, the transistor 330A, and the resistor 335 together define a first path for the first current. The transistor 325B is active and the second current flows from the output terminal 315B, the transistor 325B, the transistor 330B, and the resistor 335. The output terminal 315B, the transistor 325B, the transistor 330B, and the resistor 335 define a second path for the second current.

The transistor 330A, which acts as a voltage controlled resistor, pre-distorts voltage at the gate of the transistor 330A. The transistor 330A is responsive to the first current to generate the first voltage that is non-linear with respect to the first current. Equation 2 indicates the non-linearity. The transistor 330B, which acts as a voltage controlled resistor, pre-distorts voltage at the gate of the transistor 330B. The transistor 330B is responsive to the second current to generate the second voltage that is non-linear with respect to the second current. Equation 3 indicates the non-linearity. The first voltage and the second voltage are control voltages that are applied to the attenuator to control the attenuation.

The isolation circuit 360A and the isolation circuit 360B isolates the voltage generating circuit 230 from high frequency of an input signal of the attenuator. The isolation circuit 360A prevents the high frequency of the input signal from interfering with voltage at the gate of the transistor 330A. The isolation circuit 360B prevents the high frequency of the input signal from interfering with voltage at the gate of the transistor 330B.

The resistor 335 and the resistor 355 are used to set the gate voltages. Further, voltage at a source of the transistor 330A or voltage at a source of the transistor 330B is equal to product of the maximum current of the DAC 305 and resistance of the resistor 335. The attenuator, for example the attenuator 225, is explained in conjunction with FIG. 4.

Figure 4:
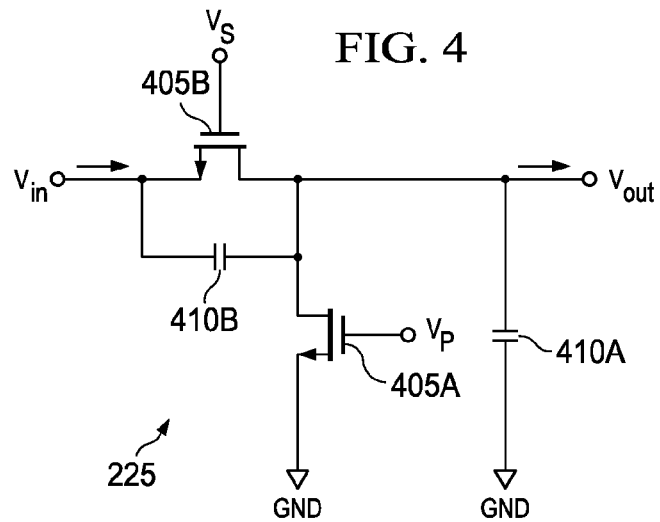
FIG. 4 illustrates an attenuator, in accordance with one embodiment.

Referring now to FIG. 4, the attenuator 225, for example a pi-type attenuator, is the voltage controlled attenuator that includes a transistor 405A and a transistor 405B. The transistor 405A and the transistor 405B have gates coupled to the voltage generating circuit 230. The transistor 405A has a source coupled to the ground supply (GND), and a drain coupled to a drain of the transistor 405B. Capacitances due to the transistor 405A and the transistor 405B are represented as a capacitor 410A and a capacitor 410B respectively.

In some embodiments, the transistor 405A and the transistor 405B are identical NMOS type transistors.

The attenuator 225 receives an input voltage (Vin) at the source of the transistor 405B and provides an attenuated output (Vout) at the drain of the transistor 405B. The first voltage (Vp) and the second voltage (Vs) are applied to the attenuator 225 to attenuate an input signal and generate linear attenuation characteristics in decibels. The first voltage is applied to the transistor 405A and the second voltage is applied to the transistor 405B. The first voltage and the second voltage are similar to voltages at gates of the transistor 405A and the transistor 405B of the attenuator 225. A voltage at a source of the transistor, for example the transistor 330A, is similar to that of the transistor 405A and a voltage at a source of the transistor, for example the transistor 330B, is similar to that of the transistor 405B. Equation (4) illustrates the linear attenuation characteristics of the attenuator 225 in decibels.

$$A = \frac{1}{1 + \frac{ka}{1-a}\frac{\sqrt{1}-\sqrt{a}}{\sqrt{1}-\sqrt{1-a}}} \quad (4)$$

where A is attenuation of the attenuator 225, a is a ratio of the first current generated from a current source, for example the current source 310A, or the second current generated from a current source, for example the current source 310B, and the maximum current generated from another current source, for example the current source 345, and k is a constant representing a ratio of sizes of the transistor 405A and the transistor 405B of the attenuator 225. After substituting value of a in equation (4), A can be represented as $$A = \frac{1}{1 + \frac{kI}{Im-I}\frac{\sqrt{Im}-\sqrt{I}}{\sqrt{Im}-\sqrt{Im-I}}} \quad (5)$$

Figure 5:
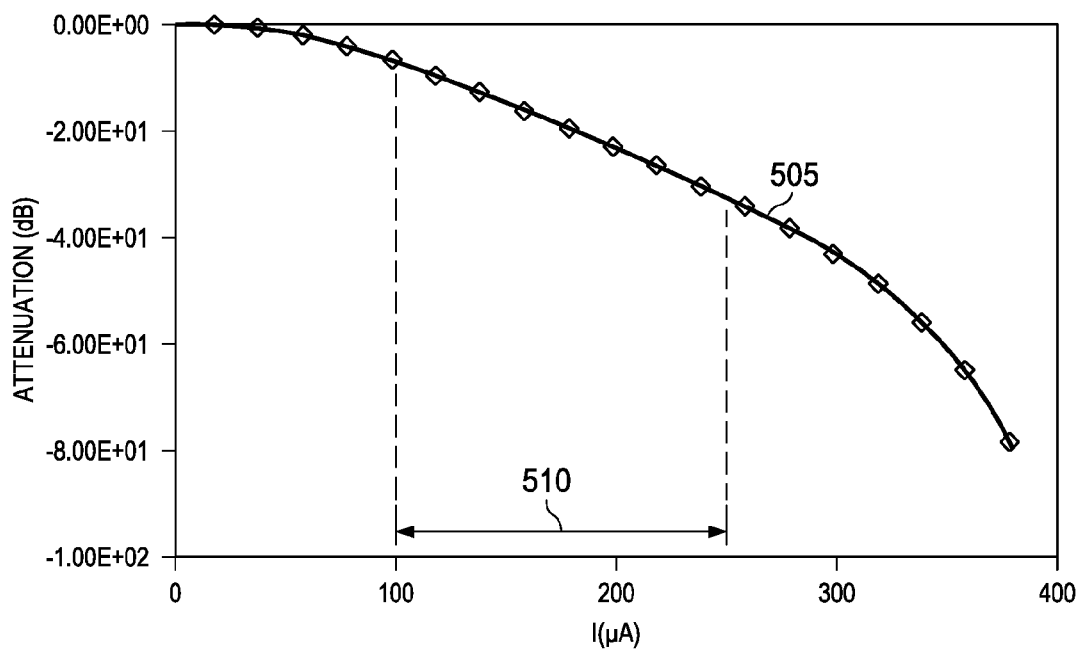
FIG. 5 illustrates attenuation characteristics of an attenuator, in accordance with one embodiment.

On substituting values of I, Im, and k in equation (5), the attenuation with respect to the first current and the second current can be obtained. For different values of the first current, the attenuation can be determined to be linear as illustrated in FIG. 5. The attenuation is also independent of process-voltage-temperature (PVT) variations as A is not dependent on voltages as illustrated in equation (5). Hence range of the DAC need not be increased and can be controlled based on the attenuation.

FIG. 5 illustrates attenuation characteristics obtained using the voltage generating circuit 230 for the attenuator 225. X axis represents variation in the first current (I), from 0 microamperes (uA) to 400 uA, provided by the current source 310A at the output terminal 315A. Y axis represents variation in the attenuation from 0.00E+00 decibels (dB) to −1.00E+02 dB. A waveform 505 corresponds to the variation in the attenuation with respect to the variation in the first current. An increase in the first current of the voltage generating circuit 230 leads to a reduction in the attenuation and vice versa. The attenuation characteristics thus generated are linear with respect to the first current as illustrated in a portion 510. Linearity of the attenuator 225 indicates that the attenuation varies in almost direct proportion to the first current. The linearity of the attenuator 225 is exhibited in the portion 510 in which the waveform 505 is approximately a straight line.

It is noted that the linearity or the linear attenuation characteristics refers to approximate linearity or to a slope of curve that is approximately equal to or closer to 1.

Figure 6:
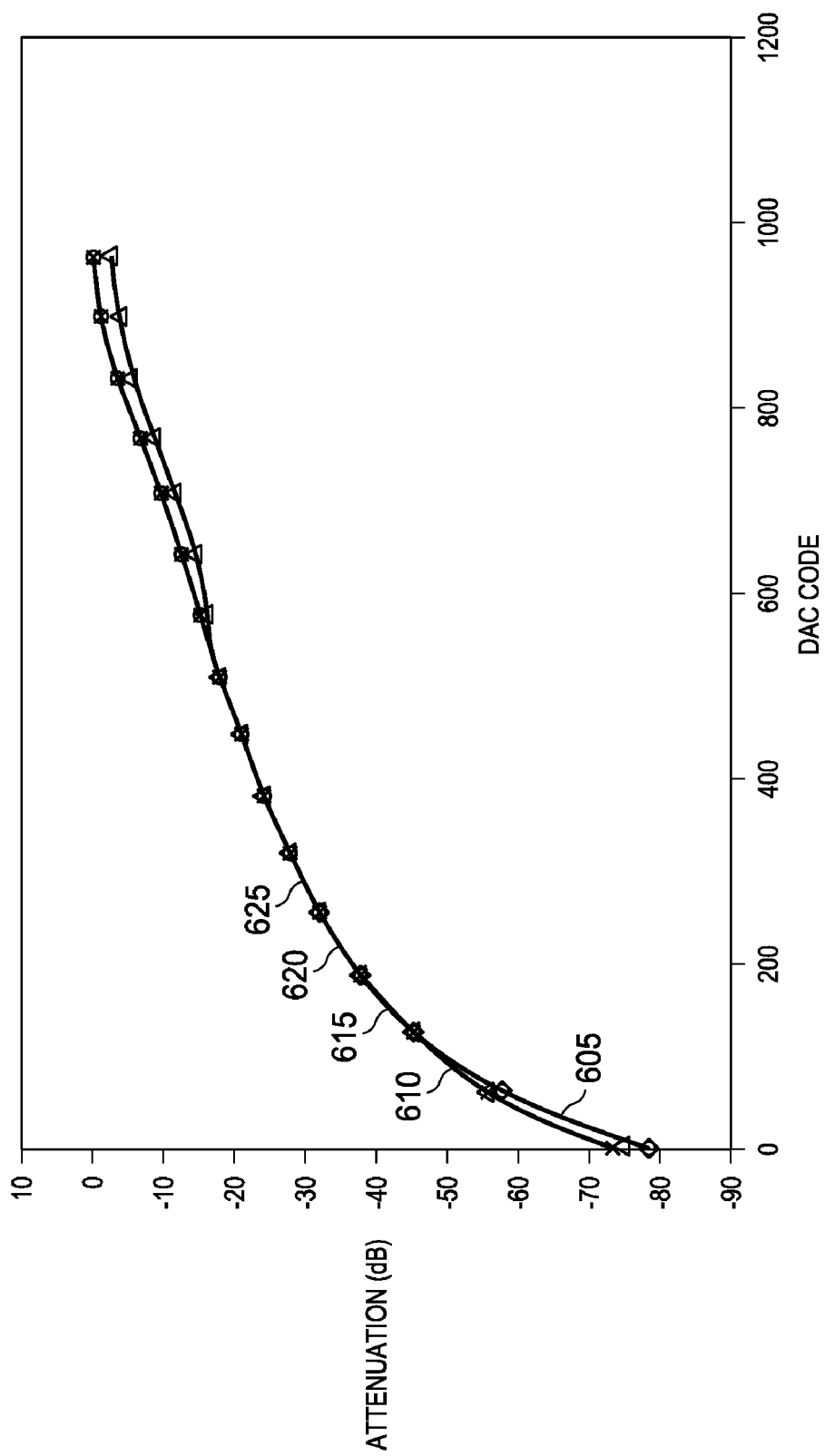
FIG. 6 illustrates attenuation characteristics of an attenuator across process-voltage-temperature variations, in accordance with one embodiment.

FIG. 6 illustrates the attenuation characteristics obtained using the voltage generating circuit 230 for the attenuator 225, across process-voltage-temperature (PVT) variations. X axis represents a DAC code that varies from 0 to 1200 and Y axis represents the attenuation that varies from −90 dB to 10 dB.

Performance of the attenuator 225 is evaluated for various process corners, for example a weak process corner, a strong process corner, and a nominal process corner. In the weak process corner, the attenuator 225 can be tested at reduced supply voltage and both high and low temperatures. In the strong process corner, the attenuator 225 can be tested at increased supply voltage and both high and low temperatures. In the nominal process corner, the attenuator 225 can be tested at a supply voltage of 0.8V and a temperature of 27° C.

A waveform 605 corresponds to the variation in the attenuation with respect to the variation in the DAC code for one weak process corner at a low temperature of −40° C. A waveform 610 corresponds to the variation in the attenuation with respect to the variation in the DAC code for another weak process corner at a high temperature of 125° C. A waveform 615 corresponds to the variation in the attenuation with respect to the variation in the DAC code for one strong process corner at a low temperature of −40° C. A waveform 620 corresponds to the variation in the attenuation with respect to the variation in the DAC code for another strong process corner at a high temperature of 125° C. A waveform 625 corresponds to the variation in the attenuation with respect to the variation in the DAC code for a nominal process corner at a temperature of 27° C. The waveform 605, the waveform 610, the waveform 615, the waveform 620, and the waveform 625 gradually show linear characteristics. It is noted that the waveform 605, the waveform 610, the waveform 615, the waveform 620, and the waveform 625 gradually overlaps with each other and hence are not visible separately but shown as one waveform. Some of the waveforms also overlap initially and hence are visible as two waveforms. A higher DAC code provides a higher attenuation. The attenuation characteristics thereby generated is independent of the PVT variations.

Figure 7:
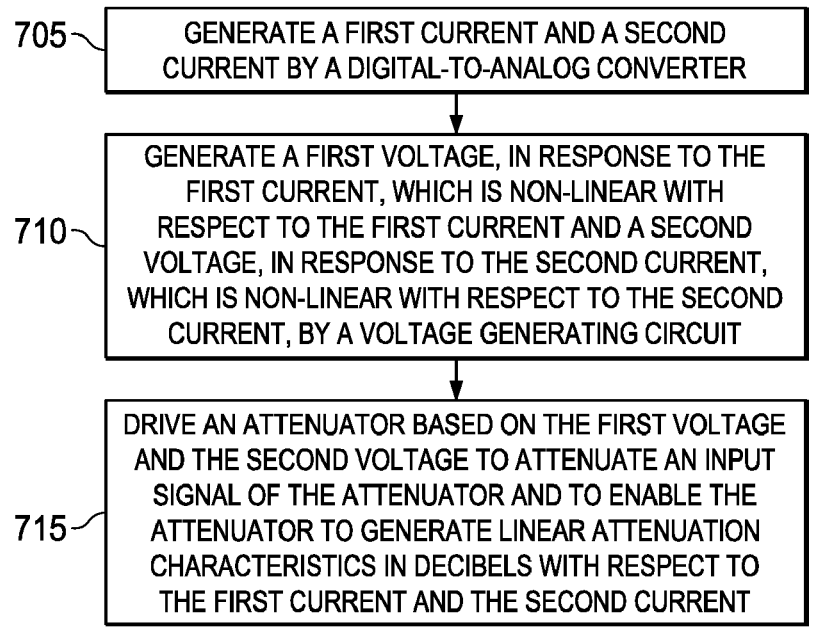
FIG. 7 is a flow diagram illustrating a method for operating an attenuator, in accordance with one embodiment.

FIG. 7 is a flow diagram illustrating a method for operating an attenuator, for example the attenuator 225, based on one or more voltages. The method helps in achieving a linear output, in decibels (dB), of a signal transmitted by a transceiver or a transmitter, for example a radio frequency (RF) transmitter, and controls power incident on a receiver, for example an RF receiver. Linear attenuation characteristics can be obtained by applying the voltages generated by a voltage generating circuit, for example the voltage generating circuit 225, to the attenuator.

At step 705, a first current and a second current is generated by a digital-to-analog converter (DAC), for example the DAC 305. The first current varies from zero to a maximum current and is differential to the second current. Hence, if the first current increases by a value, the second current decreases by an equal value.

At step 710, a first voltage and a second voltage are generated in response to the first current and the second current respectively. The first voltage is non-linear with respect to the first current and the second voltage is non-linear with respect to the second current. A first plurality of transistors can be coupled in a series connection to the DAC to define a path for the first current and to generate the first voltage. A second plurality of transistors can be coupled in a series connection to the DAC to define a path for the second current and to generate the second voltage.

The generation of the first voltage and the second voltage can be controlled using a control circuit. The control circuit includes a current source and a diode. Voltages at gates of a first one of the first plurality of transistors and of a first one of the second plurality of transistors can be controlled using the diode in combination with the current source.

At step 715, the attenuator is driven based on the first voltage and the second voltage to attenuate an input signal. The attenuator further generates the linear attenuation characteristics in decibels with respect to the first current and the second current.

The voltage generating circuit is isolated from the attenuator to prevent interference due to the input signal of the attenuator from coupling back to the voltage generating circuits.

Figure 8:
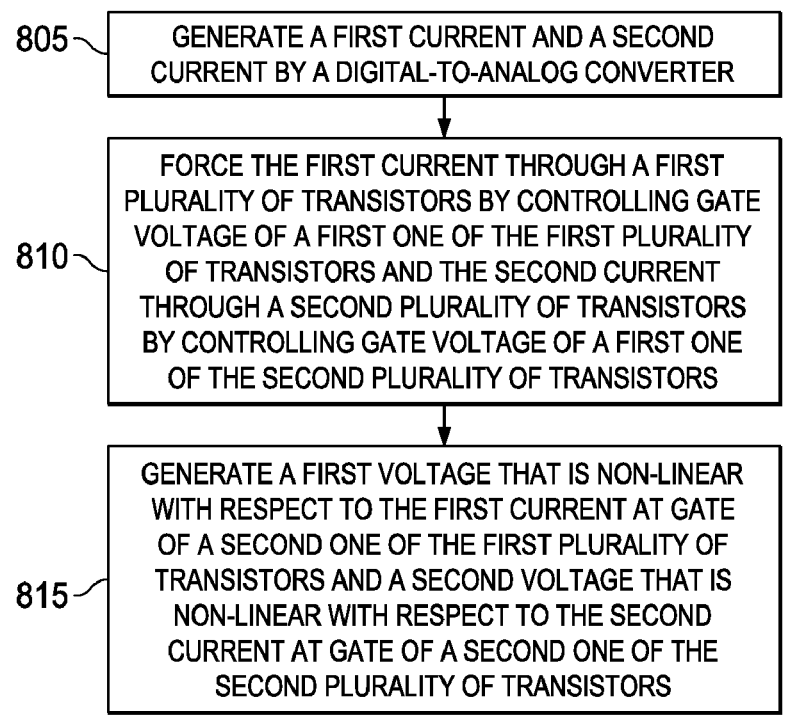
FIG. 8 is a flow diagram illustrating a method for generating non-linear voltage, in accordance with one embodiment.

FIG. 8 is a flow diagram illustrating a method for generating non-linear voltages.

At step 805, a first current and a second current is generated by a digital-to-analog converter (DAC), for example the DAC 305.

At step 810, the first current is forced through a first plurality of transistors by controlling gate voltage of a first one, for example the transistor 325A, of the first plurality of transistors and the second current is forced through a second plurality of transistors by controlling gate voltage of a first one, for example the transistor 325B, of the second plurality of transistors.

At step 815, a first voltage that is non-linear with respect to the first current is generated at a gate of a second one, for example the transistor 330A, of the first plurality of transistors and a second voltage that is non-linear with respect to the second current is generated at a gate of a second one, for example the transistor 330B, of the second plurality of transistors.

The generation of non-linear and differential voltages, for example the first voltage and the second voltage, provide linear attenuation characteristics for an attenuator. The linear attenuation characteristics enable control of the power incident on a receiver. The linear attenuation characteristics can also enhance supply rejection and common mode noise rejection performance. Further, range of the DAC need not be increased to obtain attenuation due to the linear attenuation characteristics in dB that is attained based on a DAC code of the DAC.

In the foregoing discussion, the term "coupled" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A circuit comprising:
   a digital-to-analog converter (DAC), coupled to a power supply, that provides a first current at a first output terminal of the DAC and a second current at a second output terminal of the DAC, the first current being differential to the second current;
   a first circuit, coupled to the first output terminal of the DAC and to the second output terminal of the DAC, that generates a first voltage and a second voltage, the first voltage being non-linear with respect to the first current and the second voltage being non-linear with respect to the second current;
   an attenuator coupled to the first circuit, and responsive to the first voltage and the second voltage to attenuate an input signal of the attenuator and to generate linear attenuation characteristics in decibels with respect to the first current and the second current;
   wherein the first circuit comprises:
      a first transistor coupled to the first output terminal of the DAC;
      a second transistor in series connection with the first transistor to define a first path for the first current and to generate the first voltage at a gate of the second transistor in conjunction with the first transistor;
      a third transistor coupled to the second output terminal of the DAC; and
      a fourth transistor in series connection with the third transistor to define a second path for the second current and to generate the second voltage at a gate of the fourth transistor in conjunction with the third transistor;
      a first isolation circuit coupled to the gate of the second transistor to isolate voltage at the gate of the second transistor from interfering with the input signal; and
      a second isolation circuit coupled to the gate of the fourth transistor to isolate voltage at the gate of the fourth transistor from interfering with the input signal.

2. The circuit as claimed in claim 1 and further comprising:
   a second circuit coupled to a gate of the first transistor and to a gate of the third transistor to control gate voltages of the first transistor and the third transistor.

3. The circuit as claimed in claim 2, wherein the second circuit comprises:
   a current source coupled to the power supply;
   a diode coupled to the current source, and having a gate coupled to the gate of the first transistor and to the gate of the third transistor to control the gate voltages of the first transistor and the third transistor; and
   a resistor in series connection with the diode to define a path for a current flowing from the current source.

4. The circuit as claimed in claim 1, wherein each isolation circuit comprises:
   a plurality of resistors in series connection; and
   a capacitor in parallel connection with the plurality of resistors.

5. The circuit as claimed in claim 1 and further comprising:
   a resistor coupled between the second transistor and ground supply, and between the fourth transistor and the ground supply to complete the first path and the second path.

6. The circuit as claimed in claim 1, wherein the first transistor, the second transistor, the third transistor and the fourth transistor are negative metal oxide semiconductor (NMOS) type transistors.

7. A circuit for generating voltages for operating an attenuator, the circuit comprising:
   a digital-to-analog converter (DAC) that provides a first current at a first output terminal of the DAC and a second current at a second output terminal of the DAC, the first current being differential to the second current;
   a first plurality of transistors coupled in a series connection to the first output terminal of the DAC to define a first path for the first current and that are responsive to the first current to generate a first voltage that is non-linear with respect to the first current;
   a second plurality of transistors coupled in a series connection to the second output terminal of the DAC to define a second path for the second current and that are responsive to the second current to generate a second voltage that is non-linear with respect to the second current;
   a control circuit coupled to gates of a first one of the first plurality of transistors and of a first one of the second plurality of transistors, and that controls voltages at the gates of the first one of the first plurality of transistors and of the first one of the second plurality of transistors; and
   a first isolation circuit coupled to a gate of a second one of the first plurality of transistors to isolate voltage at the gate of the second one of the first plurality of transistors from interfering with an input signal of the attenuator; and
   a second isolation circuit coupled to a gate of a second one of the second plurality of transistors to isolate voltage at the gate of the second one of the second plurality of transistors from interfering with the input signal of the attenuator.

8. The circuit as claimed in claim 7, wherein the control circuit comprises:
   a current source coupled to a power supply;
   a diode coupled to the current source, and having a gate coupled to the first one of the first plurality of transistors and of the first one of the second plurality of transistors to control the voltages at the gates of the first one of the first plurality of transistors and of the first one of the second plurality of transistors; and
   a resistor in series connection with the diode to define a path for a current flowing from the current source.

9. The circuit as claimed in claim 8, wherein the first one of the first plurality of transistors, the first one of the second plurality of transistors and the diode are identical negative metal oxide semiconductor (NMOS) type transistors.

10. The circuit as claimed in claim 7, wherein the second one of the first plurality of transistors and the second one of the second plurality of transistors are identical negative metal oxide semiconductor (NMOS) type transistors.

11. The circuit as claimed in claim 7 and further comprising:
   a resistor coupled between the second one of the first plurality of transistors and ground supply, and between the second one of the second plurality of transistors and the ground supply to complete the first path and the second path.

* * * * *